(12) United States Patent
Mora Sanchez

(10) Patent No.: US 9,091,741 B2
(45) Date of Patent: Jul. 28, 2015

(54) PROPORTIONAL-INTEGRAL-DERIVATIVE (PID) ANALOG CONTROLLER AND A METHOD FOR TESTING A PID ANALOG CONTROLLER OF A DC/DC CONVERTER

(71) Applicant: NXP B.V., Eindhoven (NL)

(72) Inventor: Rodrigo Alexander Mora Sanchez, Hamburg (DE)

(73) Assignee: NXP B.V., Eindhoven (NL)

( * ) Notice: Subject to any disclaimer, the term of this patent is extended or adjusted under 35 U.S.C. 154(b) by 282 days.

(21) Appl. No.: 13/705,508

(22) Filed: Dec. 5, 2012

(65) Prior Publication Data

US 2014/0152339 A1   Jun. 5, 2014

(51) Int. Cl.
*G01R 31/40* (2014.01)
*G05F 1/46* (2006.01)
*H02M 3/00* (2006.01)
*H02M 1/00* (2007.01)

(52) U.S. Cl.
CPC .............. *G01R 31/40* (2013.01); *G05F 1/468* (2013.01); *H02M 3/00* (2013.01); *H02M 2001/0003* (2013.01)

(58) Field of Classification Search
CPC ............ H02M 3/157; H02M 2001/0012; H02M 3/33584; H02M 3/156; H02M 3/33569; H02M 2001/0003; H02M 3/00; H02M 7/53873; H02M 1/425; G01N 21/274; G01R 31/36; G01R 31/40; G01R 27/2605; G01R 35/007; G05B 13/021; G05B 15/00–15/02; G05B 11/00; G05B 13/00; H02P 21/00; G05F 1/468; H02J 2007/0059; H02J 2007/0062; H02J 7/0052; H02J 7/0065; H03K 7/08; H03L 5/00; G06F 3/012
See application file for complete search history.

(56) References Cited

U.S. PATENT DOCUMENTS

| 7,459,864 B2 * | 12/2008 | Lys ............................ 315/291 |
| 7,772,904 B1 * | 8/2010 | Cooke ........................ 327/175 |
| 2008/0252280 A1 * | 10/2008 | Prodic et al. ................. 323/283 |
| 2010/0208501 A1 * | 8/2010 | Matan et al. .................. 363/95 |

OTHER PUBLICATIONS

K. Arabi and B. Kaminska, "Design for Testability of Embedded Integrated Operational Amplifiers", IEEE Journal of Solid-State Circuits, vol. 33, nr. 4, pp. 573-581, Apr. 1998.
K. Arabi and B. Kaminska, "Oscillation-Test Methodology for Low-Cost Testing of Active Analog Filters", IEEE Trans. on Instrumentation and Measurement, vol. 48, nr. 4, pp. 798-806, Aug. 1998.
(Continued)

*Primary Examiner* — Vinh Nguyen

(57) ABSTRACT

Embodiments of a method for testing a Proportional-Integral-Derivative (PID) analog controller of a Direct Current (DC)/DC converter and a PID analog controller of a DC/DC converter are described. In one embodiment, a method for testing a PID analog controller of a DC/DC converter involves setting an analog regulation loop, which is formed by an operational transconductance amplifier (OTA) of the PID analog controller and a feedback network of the PID analog controller, to a stable condition and testing a DC parameter of the PID analog controller and setting the analog regulation loop to an unstable condition and testing an Alternate Current (AC) parameter of the PID analog controller. Other embodiments are also described.

20 Claims, 6 Drawing Sheets

(56) References Cited

OTHER PUBLICATIONS

B. Kruseman, B. Tasić, C. Hora, J. Dohmen, H. Hashempour, M. van Beurden and Y. Xing, "Defect Oriented Testing for Analog/Mixed-Signal Devices", 2011 IEEE International Test Conference, pp. 1-10, Sep. 2011.

B. Butterfield; "Optimizing Transient Response of Internally Compensated dc-dc Converters with Feedforward Capacitor", Texas Instruments, Application Report—SLVA289; Jan. 2008.

* cited by examiner

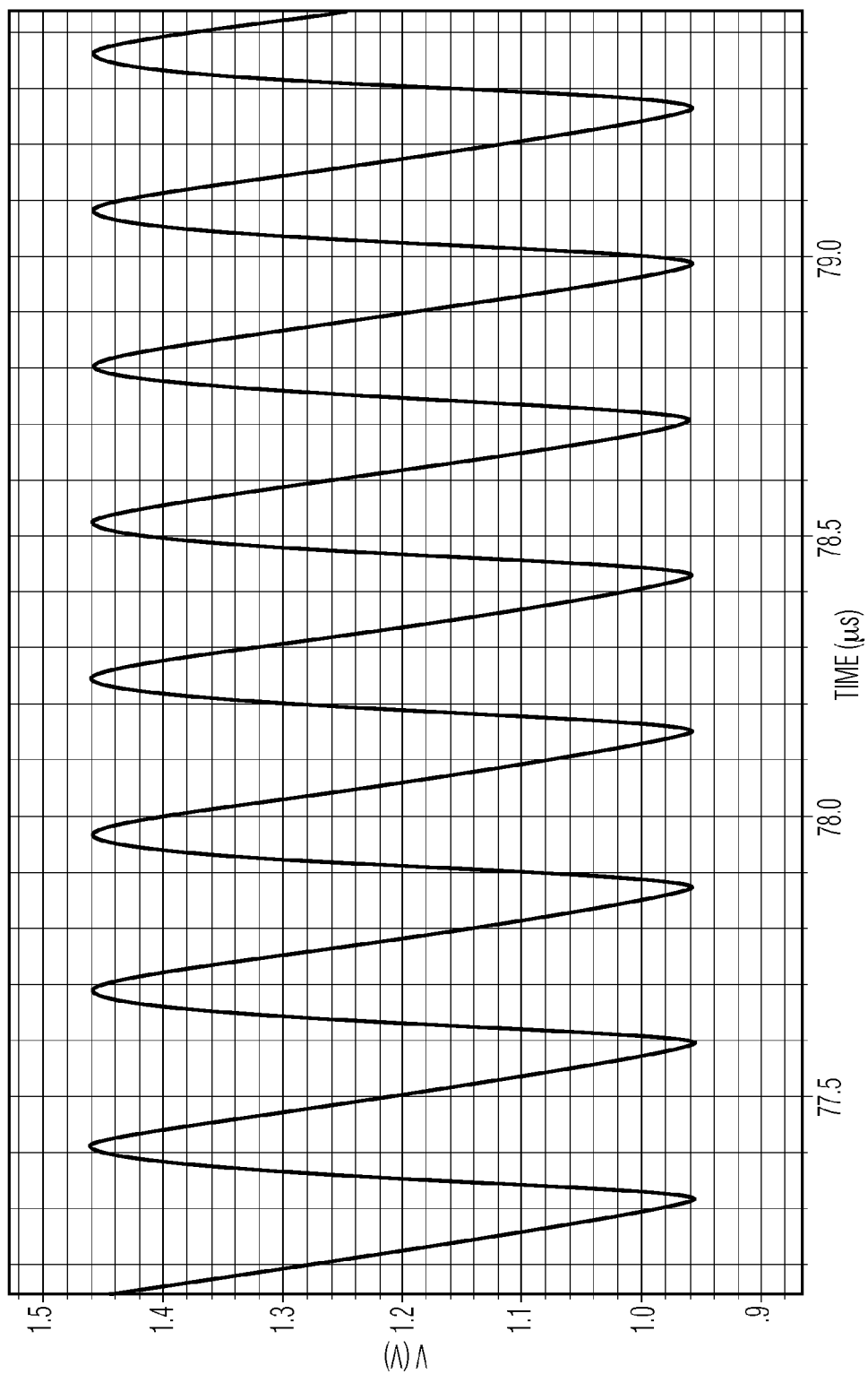

PROPORTIONAL-INTEGRAL-DERIVATIVE (PID) ANALOG CONTROLLER AND A METHOD FOR TESTING A PID ANALOG CONTROLLER OF A DC/DC CONVERTER

Voltage conversion circuits, such as, low-dropout regulators (LDOs), voltage reference circuits, and direct current (DC)/DC converters, are widely used in consumer, computing, and communication products. As is known in the art, a DC/DC converter converts a source of DC voltage from one voltage level to another. There are basically two test approaches to ensure proper functioning of a DC/DC converter, namely functional testing and structural testing. Functional testing attempts to validate that a circuit under test functions according to its functional specification. However, the parasitic impedance of the test setup circuit used in industrial testing (e.g., probes of an industrial tester) can affect the closed loop performance of a DC/DC converter. For example, the parasitic impedance of embedded testing circuits can increase the demand for power, raise power supply and ground fluctuations, and change the characteristics of an output low-pass filter, all of which can negatively affect the closed loop stability of a DC/DC converter. Because the test setup can negatively affect the performance of a DC/DC converter, the functional testing approach is generally not fit for DC/DC converter industrial testing.

Compared to functional testing, a structural testing approach tries to make sure that the circuit has been assembled correctly. This approach is a Design for Testability (DfT) based test concept that requires adding circuitry to support testing. In the structural testing approach, one or more functional blocks of a DC/DC converter are tested separately via an on-chip DfT interface, aiming at allowing digital and low-frequency testing using a low-cost digital tester. Generally, one of the most difficult blocks to test in a DC/DC converter that uses an analog regulation loop is the analog controller that is used to stabilize the DC/DC converter in closed-loop configuration. For example, a Proportional-Integral-Derivative (PID) analog controller can be used to stabilize the output of a DC/DC converter. However, the PID analog controller has a large DC gain, which makes it difficult to directly test the dynamic performance of the PID analog controller, which defines the converter's closed-loop stability. Specifically, a stimuli applied at an input/output (I/O) pin of the PID analog controller can saturate the output of an operational amplifier (op-amp) or an operational transconductance amplifier (OTA) of the PID analog controller. Compared to an opamp, an OTA does not include a buffer output stage with low output resistance, and consequently, occupies less circuit area and consumes less power. In addition, the regulation loop of the DC/DC converter cannot be closed during testing.

One approach to indirectly test analog blocks, such as an opamp or an OTA, of a PID analog controller is an oscillation-test strategy, whereby the block to be tested is converted into an oscillating circuit whose frequency relates to the block's parameters. For example, a set of resistors and capacitors can be used to turn an amplifier into an oscillation circuit by creating a positive feedback network around the amplifier, making it oscillate. However, an OTA of a PID analog controller is capable of driving only capacitive loads and is not suitable for driving resistive loads. Consequently, when the oscillation-test strategy is used to test an OTA of a PID analog controller, resistors with large resistance are needed in order to reduce the resistive load seen by the OTA.

Another approach to indirectly test a PID analog controller is to use the PID analog controller's OTA as a comparator. Specifically, a step voltage is applied at an input/output (I/O) pin of the PID analog controller and then the propagation time is measured at the output of the PID analog controller via a DfT interface. Generally, an impedance network is coupled in parallel with the OTA of a PID analog controller to set the proportional, integral and derivative parameters of the PID controller. However, not all defects in the impedance network can be detected using this approach. For example, if the impedance network includes a resistor connected in series with a capacitor, a bridge fault in the resistor of the impedance network cannot be detected if the capacitor of the impedance network is fault free. In addition, the propagation time measured at the output of the PID analog controller is very sensitive to the steepness of stimulus applied at the I/O pin. Furthermore, because the OTA is used as a comparator during testing, the OTA does not operate at its intended DC operating point.

Embodiments of a method for testing a PID analog controller of a DC/DC converter and a PID analog controller of a DC/DC converter are described. In one embodiment, a method for testing a PID analog controller of a DC/DC converter involves setting an analog regulation loop, which is formed by an OTA of the PID analog controller and a feedback network of the PID analog controller, to a stable condition and testing a DC parameter of the PID analog controller and setting the analog regulation loop to an unstable condition and testing an Alternate Current (AC) parameter of the PID analog controller. Setting the analog regulation loop into different stability conditions causes the changes in the oscillation behavior of the PID analog controller, which allows the DC and AC parameters of the PID analog controller to be tested. Embedding a feedback network in a PID analog controller of a DC/DC converter offers a DfT solution with small area overhead that allows the testing of the PID controller using a low-cost tester. Other embodiments are also described.

In one embodiment, a method for testing a PID analog controller of a DC/DC converter involves setting an analog regulation loop, which is formed by an OTA of the PID analog controller and a feedback network of the PID analog controller, to a stable condition and testing a DC parameter of the PID analog controller and setting the analog regulation loop to an unstable condition and testing an AC parameter of the PID analog controller.

In one embodiment, a PID analog controller of a DC/DC converter includes an OTA, a feedback network connected to a terminal of the PID analog controller at which an output voltage of the DC/DC converter is received and to an output terminal of the OTA, and a capacitor. The feedback network includes a first CMOS switch connected to the output terminal of the OTA, a second CMOS switch, an NMOS transistor connected to the first CMOS switch and to the terminal of the PID analog controller, and a pull-down transistor connected to the first CMOS switch and to the NMOS transistor. The capacitor is connected to the OTA through the second CMOS switch and to the terminal of PID analog controller.

In one embodiment, a method for testing a PID analog controller of a buck DC/DC converter involves setting an analog regulation loop, which is formed by an OTA of the PID analog controller and a feedback network of the PID analog controller, to a stable condition and testing a DC parameter of the PID analog controller and setting the analog regulation loop to an unstable condition and testing an AC parameter of the PID analog controller. Setting the analog regulation loop, which is formed by the OTA of the PID analog controller and the feedback network of the PID analog controller, to the stable condition includes closing a first CMOS switch of the feedback network to electrically connect a gate terminal of an NMOS transistor of the feedback network to an output terminal of the OTA and opening a second CMOS switch of the feedback network that is connected to a capacitor that is connected between a terminal of the PID analog controller at which an output voltage of the DC/DC converter is received and to a first input terminal of the OTA to electrically disconnect the capacitor from the feedback network. A source terminal of the NMOS transistor is connected to the terminal of the PID analog controller and a drain terminal of the NMOS transistor is connected to a supply voltage. Setting the analog regulation loop to an unstable condition and testing the AC parameter of the PID analog controller includes closing the second CMOS switch of the feedback network to electrically connect the capacitor to the feedback network.

Other aspects and advantages of embodiments of the present invention will become apparent from the following detailed description, taken in conjunction with the accompanying drawings, depicted by way of example of the principles of the invention.

FIGS. 4a and 4b depict examples of a transient analysis of the PID analog controller depicted in FIG. 2.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
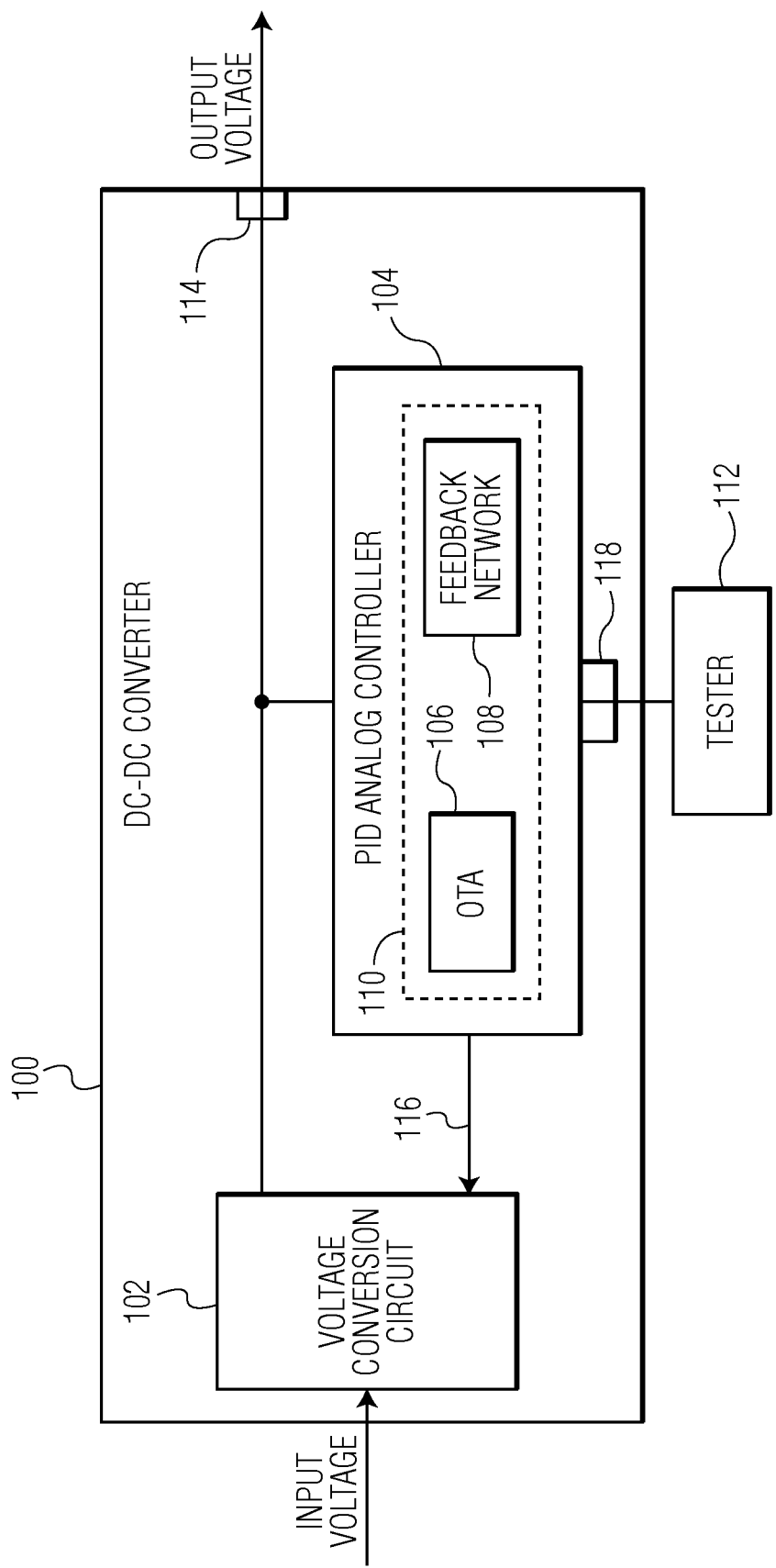
FIG. 1 is a schematic block diagram of a DC-DC converter that includes a PID analog controller in accordance with an embodiment of the invention.

FIG. 1 is a schematic block diagram of a DC-DC converter 100 in accordance with an embodiment of the invention. The DC-DC converter converts a DC input voltage into a DC output voltage. In an embodiment, the DC-DC converter is a buck DC-DC converter that converts the input voltage into an output voltage that is lower than the input voltage. For example, the DC-DC converter may be an internally compensated DC/DC buck converter. In another embodiment, the DC-DC converter is a boost DC-DC converter that converts the input voltage into an output voltage that is higher than the input voltage. The DC-DC converter is typically integrated in a power supply circuit. For example, the DC-DC converter can be included in a computing device, such as a smartphone, a tablet computer, a laptop, etc. For example, the DC-DC converter may be a buck converter that converts main voltage (e.g., 12-24 volts (V)) in a computer down to the voltage level (e.g., 0.8-1.8 V) suitable for the central processing unit (CPU).

In the embodiment depicted in FIG. 1, the DC-DC converter 100 is controlled by analog regulation. In particular, the DC-DC converter 100 includes a voltage conversion circuit 102 and a Proportional-Integral-Derivative (PID) analog controller 104. The voltage conversion circuit performs the DC voltage conversion. In particular, the voltage conversion circuit converts the input voltage into the output voltage, which can be lower than, equal to, or higher than the input voltage.

The PID analog controller 104 is connected to an output terminal 114 of the DC/DC converter 100 from which the output voltage is provided and is configured to stabilize the output of the DC/DC converter. In the embodiment depicted in FIG. 1, the PID analog controller 104 communicates to the voltage conversion circuit 102 through a connection 116. As is known in the art, the PID analog controller is a feedback controller that uses a control loop feedback mechanism. In particular, the PID analog controller calculates a difference value between a measured output voltage and a desired output voltage, based on three separate constant parameters, the proportional, the integral, and the derivative values, denoted as "P," "I," and "D." Heuristically, these three values can be interpreted in terms of time: the proportional value, "P," depends on the present error, the integral value, "I," depends on the accumulation of past errors, and the derivative value, "D," is a prediction of future errors, based on current rate of change. By tuning the three parameters, the PID analog controller can provide control action designed for specific requirements.

In the embodiment depicted in FIG. 1, the PID analog controller 104 includes an operational transconductance amplifier (OTA) 106 and a feedback network 108. The feedback network 108 can be implemented in one or more transistors, such as NMOS/PMOS transistors, and one or more switches, such as CMOS switches. Components of the PID analog controller 104 can form an analog regulation loop that is used for testing purposes and is not active during normal operation of the PID analog controller. In the embodiment depicted in FIG. 1, the OTA 106 and the feedback network 108 form an analog regulation loop 110.

A tester or controller 112 is connected to the PID analog controller 104 by means of a DfT interface 118 and is configured to test and/or control the PID analog controller 104. In the embodiment depicted in FIG. 1, the tester 112 sets the analog regulation loop to different stability conditions. For example, the tester can set the analog regulation loop to a stable condition or to an unstable condition. Setting the analog regulation loop 110 into different stability conditions causes the changes in the oscillation behavior of the PID analog controller, which allows the DC and AC parameters of the PID analog controller to be tested. In one embodiment, only one CMOS switch and a NMOS transistor working in saturation are required in order to configure the PID analog controller as a stable closed-loop system. In one embodiment, only an additional CMOS switch is required in order to make the re-configured controller oscillate at a frequency that depends on the PID-controller's parameters. The tester can be a low-cost digital tester, such as a J750 test system from TERADYNE Inc. Although the tester is shown in FIG. 1 as being separate from the PID analog controller, in other embodiments, the tester is integrated into the PID analog controller.

Embedding the feedback network 108 into the PID analog controller 114 of the DC/DC converter 100 offers a DfT solution with small area overhead that allows the testing of the PID analog controller using a low-cost tester 112. An example operation of the tester 112 for testing the PID analog controller 104 is described as follows. In the example operation, two separate steps are used to measure the DC performance and the AC performance of the PID analog controller. In a first step, the tester sets the analog regulation loop in a stable condition under which at least one DC parameter of the PID analog controller is tested. Examples of DC parameters include, without being limited to, the OTA's DC gain, expected DC output voltage and DC accuracy. In a second step, the tester sets the analog regulation loop in an unstable condition under which at least one AC parameter of the PID analog controller is tested. Examples of AC parameters include, without being limited to, the OTA's bandwidth and the overall PID bandwidth, which depends on the P, I, and D parameters of the PID analog controller.

Figure 2:
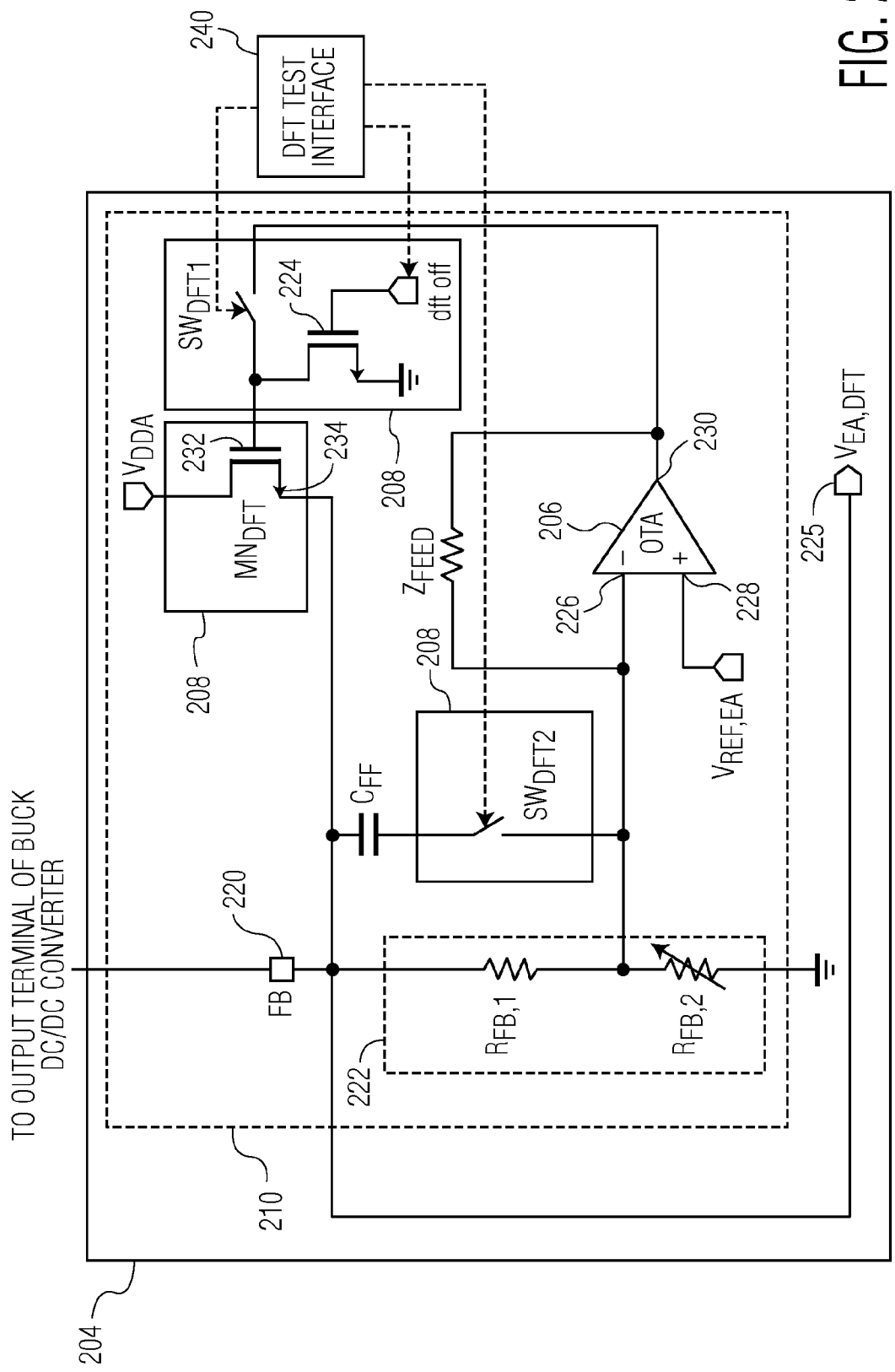
FIG. 2 depicts an embodiment of the PID analog controller of the DC-DC converter of FIG. 1.

Turning now to FIG. 2, components of a PID analog controller 204, which is representative of the PID analog controller 104 depicted in FIG. 1, are shown. In the embodiment depicted in FIG. 2, the PID analog controller 204 includes a feedback (FB) pin 220, resistors, "$R_{FB,1}$," "$R_{FB,2}$," that form a feedback divider network 222, an operational transconductance amplifier (OTA) 206, an impedance circuit "$Z_{feed}$," a capacitor, "$C_{FF}$," CMOS switches, "$SW_{DFT1}$," "$SW_{DFT2}$," an NMOS transistor, "$MN_{DFT}$," and a pull-down transistor 224.

The PID analog controller 204 is a part of a buck DC/DC converter (not shown). The feedback (FB) pin 220 is connected to an output terminal (not shown) of the buck DC/DC converter from which the DC output voltage is outputted and is configured to stabilize the output of the buck DC/DC converter.

The feedback (FB) pin is connected to a voltage terminal 225, from which the voltage, "$V_{EA,DFT}$," of the PID analog controller 204 is outputted. The voltage, "$V_{EA,DFT}$," cannot be directly measured at the FB pin 220 because the parasitic impedance of the testing setup circuit will affect the response of the PID analog controller 204. Instead, the voltage, "$V_{EA,DFT}$," of the PID analog controller is internally buffered by a DfT interface (not shown).

The CMOS switches, "$SW_{DFT1}$," "$SW_{DFT2}$," the NMOS transistor, "$MN_{DFT}$," and the pull-down transistor 224 form a feedback network or feedback circuit 208. The feedback network 208, the OTA 206, the resistors, "$R_{FB,1}$," "$R_{FB,2}$," the impedance circuit, "$Z_{feed}$," and the capacitor "$C_{FF}$" form an analog regulation loop 210. The NMOS transistor, "$MN_{DFT}$," is connected to a voltage terminal $V_{DD4}$ from which a supply voltage is applied to the feedback network 208, and is configured to operate in saturation as a source follower. A control terminal, "dft_off," is connected to the pull-down transistor. The CMOS switch, "$SW_{DFT1}$," is connected to the pull-down transistor, to the output terminal 230 of the OTA 206, and to the gate terminal 232 of the NMOS transistor, "$MN_{DFT}$." The CMOS switch, "$SW_{DFT2}$," is connected in series to the feed-forward capacitor, "$C_{FF}$," between the source terminal 234 of the NMOS transistor, "$MN_{DFT}$," and a first input terminal 226 of the OTA 206. A second input terminal 228 of the OTA 206 is connected to a reference voltage, "$V_{REF\_EA}$." Although the first and second input terminals of the OTA 206 are shown in FIG. 2 as being a negative input terminal and a positive input terminal, respectively, in some embodiments, the polarity of the first and second input terminals of the OTA 206 can be reversed, provided that there is still a negative feedback for the OTA.

The capacitor, "$C_{FF}$," is utilized to improve the transient response of the buck DC/DC converter by adding a zero and a pole to the transfer function in terms of spatial or temporal frequency of the feedback divider network 222 that is formed by the resistors, "$R_{FB,1}$," "$R_{FB,2}$." This leads to a boost in the gain of the feedback at mid-to-high frequencies, which increases the bandwidth of the PID analog controller, improving the transient response of the buck DC/DC converter. Consequently, the capacitor, "$C_{FF}$," can bring the analog regulation loop of the PID controller into an oscillation condition because the phase margin of the analog regulation loop of the PID controller, which is the difference between −180° and the actual open-loop phase when the open-loop gain reaches 0 dB, can worsen and become negative if the capacitance of the capacitor, "$C_{FF}$," is set in a certain range.

Some examples of operations of the PID analog controller 204 are described as follows. In these examples, a switch is in a non-conducting state if the switch is "open," while a switch is in a conducting state if the switch is "closed." A tester or controller (not shown) may be used to control the CMOS switches "$SW_{DFT1}$," "$SW_{DFT2}$" via a DfT interface 240. During normal operation in which the PID analog controller 204 is not being tested, the analog regulation loop 210 of the PID analog controller is inactive. During normal operation, the CMOS switch, "$SW_{DFT1}$," is open (i.e., non-conducting). The CMOS switch, "$SW_{DFT1}$," is pulled to the ground by pull-down transistor 224, which closes the NMOS transistor, "$MN_{DFT}$." In the normal operation, the CMOS switch, "$SW_{DFT2}$," is closed in order to electrically connect the capacitor, "$C_{FF}$," to a compensation network formed by the divider network 222, the OTA 206, and the impedance circuit, "$Z_{feed}$."

During a testing operation, the PID analog controller 204 is in the DfT mode in which the OTA 206 drives a capacitive load and consequently, operates at the intended DC operating point. In an embodiment, the optimal parameters of the PID analog controller 204 that ensure both stability of the DC/DC converter and intended operation of the PID analog controller 204 in the DfT mode are found using an iterative process. A two-step approach is used in order to test the PID analog controller 206 using the DfT interface 240.

In a first step, the capacitor, "$C_{FF}$," is electrically disconnected from the feedback network by opening CMOS switch, "SW$_{DFT2}$," and at least one DC characteristic of the PID analog controller is tested. In the first step, the PID analog controller 204 is configured as a stable closed-loop system (i.e., in a stable condition) via the DfT interface 240 by closing the CMOS switch, "SW$_{DFT1}$," releasing the pull-down transistor 224 and opening the CMOS switch, "SW$_{DFT2}$." The pull-down transistor is set to a high-impedance state (i.e., the off state) during testing. The NMOS transistor, "MN$_{DFT}$," closes the regulation loop 210. The PID analog controller works as a stable system and the analog regulation loop 210 of the PID analog controller does not oscillate. In the stable condition, the phase margin of the analog regulation loop 210 of the PID analog controller is larger than 0°, which can be found using an iterative process. In the first step, a DfT analog buffer (not shown) can be employed for buffering the output voltage V$_{EA,DFT}$.

In a second step, the AC performance of the PID analog controller 204 is tested. In the second step, the CMOS switch, "SW$_{DFT2}$," is closed by the DfT interface 240 and the capacitor, "C$_{FF}$," is electrically connected to the feedback network 208. By adjusting the capacitance value of the capacitor, "C$_{FF}$," to a threshold capacitance value, the phase margin of the PID analog controller's loop, which is the analog regulation loop 210, becomes negative and the analog regulation loop 210 of the PID analog controller 204 is set to an unstable condition and starts to oscillate. In an embodiment, the optimal capacitance value of the capacitor, "C$_{FF}$," is found using an iterative process. Because both the frequency and the amplitude of the oscillation depend on the compensation network and on the OTA's transfer functions, the AC performance of the PID analog controller can be tested. Defects can be detected by measuring the oscillation signal, which can be digitized by an on-chip window comparator (not shown).

The feedback network 208 typically only occupies a relatively small circuit area of the PID analog controller 204. Consequently, the area overhead attributed to the feedback network is small. Because both the DC performance and the AC performance of the PID analog controller 204 can be tested at the expense of a small area overhead, the testability of the PID analog controller of the buck DC/DC converter is greatly improved and the product quality is enhanced. The PID analog controller 204 enables detection of all bridge defects in the PID analog controller's compensation network. Additionally, the PID analog controller enables testing of the OTA in the intended DC operating point, which improves the test coverage of the OTA. Furthermore, because most defects affecting the performance of the PID analog controller can be detected by examining deviations in the controller's DC and AC parameters, the overall testing coverage of the PID analog controller is improved.

Figure 3:
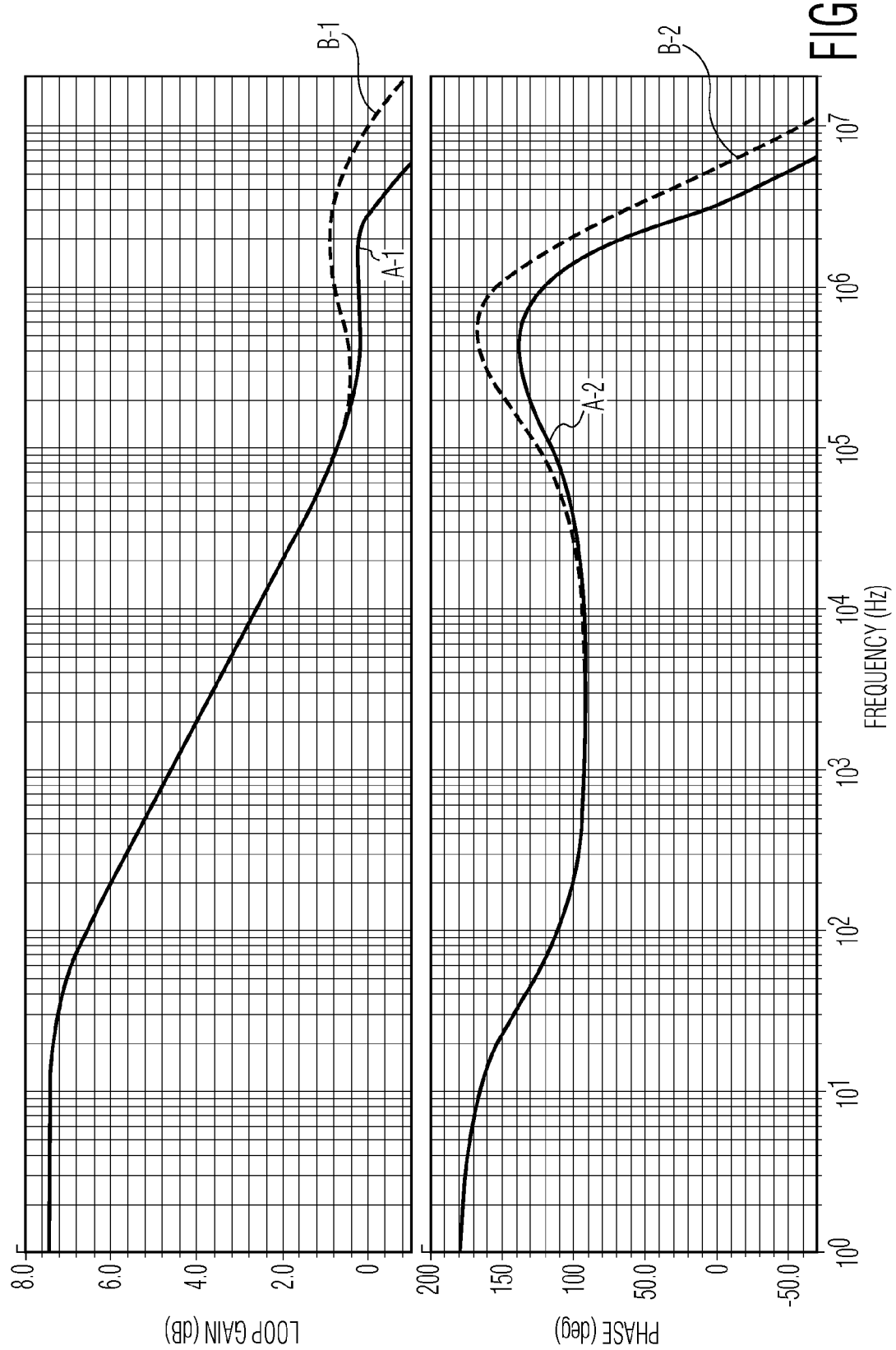
FIG. 3 depicts an example of a stability analysis of the PID analog controller depicted in FIG. 2.
Figure 4A:
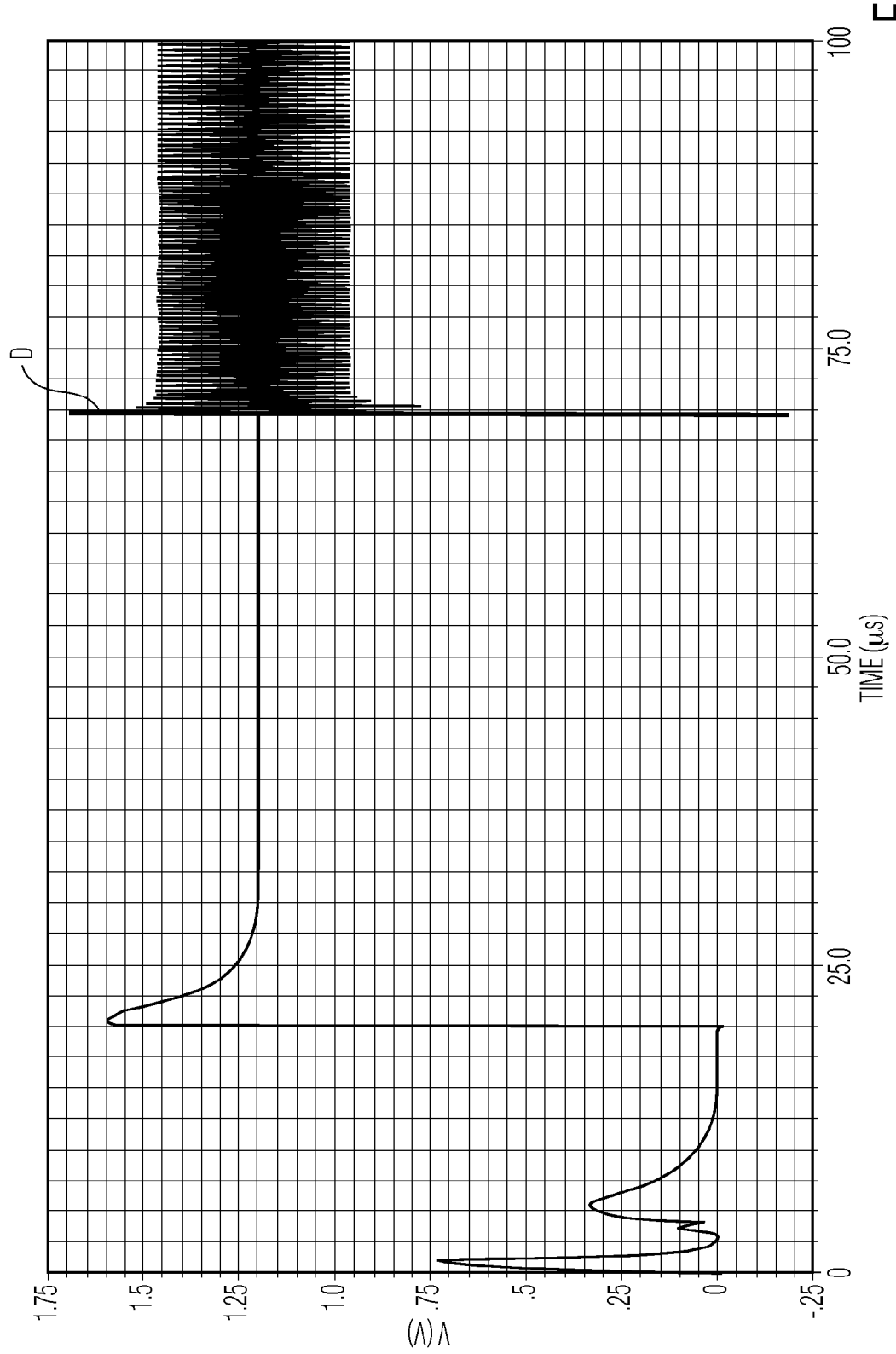

Examples of stability analysis and transient analysis of the PID analog controller 204 are shown in FIGS. 3, 4a and 4b. FIG. 3 depicts an example of a stability analysis of the PID analog controller 204 depicted in FIG. 2. The stability analysis is used to demonstrate the worsening of the phase margin in the frequency domain. In particular, the upper section of FIG. 3 depicts the magnitude of the loop gain (dB) of the PID analog controller 204 and the lower section of FIG. 3 depicts the phase (deg) of the analog regulation loop 210 of the PID analog controller 204. When the analog regulation loop is in a stable condition, the capacitor, "C$_{FF}$," is disconnected from the feedback network 208 and the phase margin of the PID analog controller's loop is positive. When the analog regulation loop is in an unstable condition, the capacitor, "C$_{FF}$," is connected to the feedback network 208, adding a zero and a pole to the frequency response of the feedback network, boosting the open-loop gain, and causing the phase margin of the PID analog controller's loop to become negative. In the upper section of FIG. 3, the curve, "A-1," represents the loop gain of the PID analog controller in a stable condition and the curve, "B-1," represents the loop gain of the PID analog controller in an unstable condition. In the lower section of FIG. 3, the curve, "A-2," represents the phase of the PID analog controller loop in a stable condition and the curve, "B-2," represents the phase of the PID analog controller loop in an unstable condition. Compared with the curve, "A-1," the curve, "B-1," has a higher loop gain when the frequency is over $10^5$ Hz. Compared with the curve, "A-2," the curve, "B-2," shows a higher phase shift when the frequency is over $10^5$ Hz.

FIGS. 4a and 4b depict examples of a transient analysis of the PID analog controller 204 depicted in FIG. 2. The transient analysis is used to demonstrate the two-step testing approach in the time domain. In particular, FIG. 4a depicts a full view of a transient voltage response of the PID analog controller 204 and FIG. 4b depicts a detailed view of a specific time period of the transient response of the PID analog controller 204. In FIG. 4a, starting from time point "0," the PID analog controller powers up in the test mode. In a first step, the DC-performance is tested by measuring the voltage "V$_{EA,DFT}$" as $(1+R_{FB,1}/R_{FB,2}) \times V_{REF,EA}$. In this first step, the capacitor, "C$_{FF}$," is disconnected from the feedback network and consequently, the PID analog controller is stable. In a second step, the capacitor, "C$_{FF}$," is connected to the feedback network 208, making the PID controller oscillate at a frequency that is related to its transfer function, allowing its AC-performance to be tested. Any fault that causes a deviation in a parameter of the PID analog controller outside an expected range can be detected. In FIG. 4a, the voltage response during the first step occurs before time line, "D," which is around 65 microseconds ( ) while the voltage response during the second step occurs after time line, "D." As shown in FIG. 4a, the voltage response during the first step is generally stable while the voltage response during the second step oscillates at a certain frequency with the amplitude of the oscillation. The oscillation frequency and amplitude are used to measure the state of the analog regulation loop of the PID analog controller. If the oscillation frequency or the amplitude of the oscillation is out of a normal range that is set for the PID analog controller, a fault within the PID analog controller is detected. FIG. 4b depicts a detailed view of the voltage response during the second step. As shown in FIG. 4b, the voltage response between 77 and 79.5 oscillates between 0.96V and 1.44V at a frequency of 3.5 Mhz.

Figure 5:
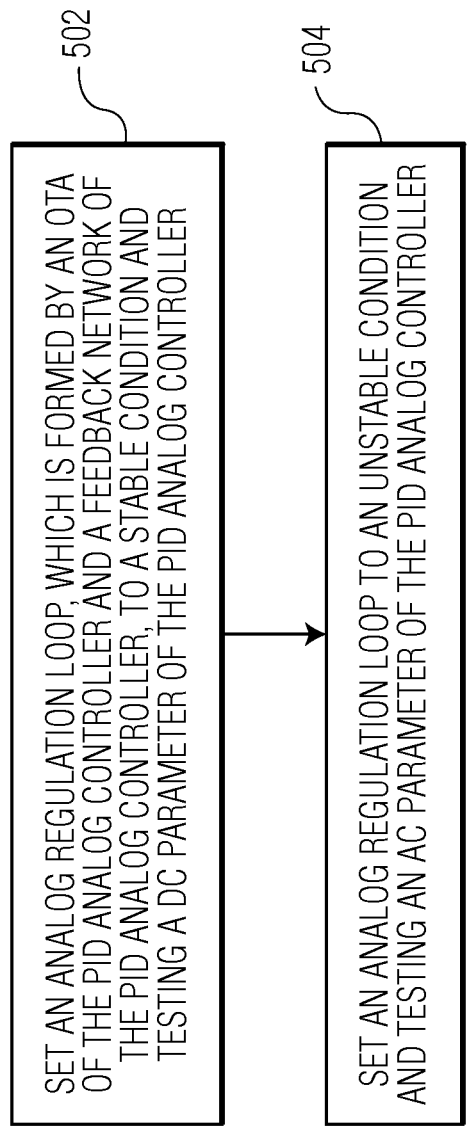
FIG. 5 is a process flow diagram that illustrates a method for testing a PID analog controller of a DC/DC converter in accordance with an embodiment of the invention.

FIG. 5 is a process flow diagram that illustrates a method for testing a PID analog controller of a DC/DC converter in accordance with an embodiment of the invention. At block 502, an analog regulation loop, which is formed by an OTA of the PID analog controller and a feedback network of the PID analog controller, is set to a stable condition and testing a DC parameter of the PID analog controller. At block 504, the analog regulation loop is set to an unstable condition and testing an AC parameter of the PID analog controller Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for testing a Proportional-Integral-Derivative (PID) analog controller of a Direct Current (DC)/DC converter, the method comprising:
    setting an analog regulation loop, which is formed by an operational transconductance amplifier (OTA) of the PID analog controller and a feedback network of the PID analog controller, to a stable condition and testing a DC parameter of the PID analog controller using a tester; and
    setting the analog regulation loop to an unstable condition and testing an Alternate Current (AC) parameter of the PID analog controller using the tester.

2. The method of claim 1, wherein a terminal of the PID analog controller receives an output voltage of the DC-DC converter.

3. The method of claim 2, wherein setting the analog regulation loop, which is formed by the OTA of the PID analog controller and the feedback network of the PID analog controller, to the stable condition and testing the DC parameter of the PID analog controller includes electrically disconnecting a capacitor that is connected between the terminal of the PID analog controller and a first input terminal of the OTA from the feedback network.

4. The method of claim 3, wherein setting the analog regulation loop, which is formed by the OTA of the PID analog controller and the feedback network of the PID analog controller, to the stable condition and testing the DC parameter of the PID analog controller further includes electrically connecting an NMOS transistor that operates in saturation to an output terminal of the OTA.

5. The method of claim 4, wherein setting the analog regulation loop to the unstable condition and testing the AC parameter of the PID analog controller further includes setting the capacitance value of the capacitor such that the phase margin of the PID analog controller becomes negative and the PID analog controller starts to oscillate.

6. The method of claim 3, wherein setting the analog regulation loop to the unstable condition and testing the AC parameter of the PID analog controller includes electrically connecting the capacitor to the feedback network.

7. The method of claim 2, wherein setting the analog regulation loop, which is formed by the OTA of the PID analog controller and the feedback network of the PID analog controller, to the stable condition and testing the DC parameter of the PID analog controller includes:
    closing a first CMOS switch of the feedback network to electrically connect an NMOS transistor of the feedback network to an output terminal of the OTA; and
    opening a second CMOS switch of the feedback network that is connected to a capacitor that is connected between the output terminal of the PID analog controller and a first input terminal of the OTA.

8. The method of claim 7, wherein closing the first CMOS switch of the feedback network includes setting a pull-down transistor connected to the NMOS transistor to a high-impedance state.

9. The method of claim 7, wherein setting the analog regulation loop to the unstable condition and testing the AC parameter of the PID analog controller includes closing the second CMOS switch of the feedback network.

10. The method of claim 9, wherein setting the analog regulation loop to the unstable condition and testing the AC parameter of the PID analog controller further includes setting the capacitance value of the capacitor such that the phase margin of the analog regulation loop becomes negative and the analog regulation loop starts to oscillate.

11. The method of claim 2, wherein the DC/DC converter is a buck DC/DC converter.

12. The method of claim 11, wherein the output voltage of the DC/DC converter is smaller than an input voltage of the DC/DC converter.

13. The method of claim 2, wherein the PID analog controller calculates a difference value between the output voltage of the DC/DC converter and a reference voltage based on proportional, integral and derivative values.

14. A Proportional-Integral-Derivative (PID) analog controller of a Direct Current (DC)/DC converter, the PID analog controller comprising:
    an operational transconductance amplifier (OTA);
    a feedback network connected to a terminal of the PID analog controller at which an output voltage of the DC/DC converter is received and to an output terminal of the OTA, wherein the feedback network comprises a first CMOS switch connected to the output terminal of the OTA, a second CMOS switch, an NMOS transistor connected to the first CMOS switch and to the terminal of the PID analog controller, and a pull-down transistor connected to the first CMOS switch and to the NMOS transistor; and
    a capacitor connected to the OTA through the second CMOS switch and to the terminal of PID analog controller.

15. The PID analog controller of claim 14, further comprising:
    an impedance circuit connected to a first input terminal of the OTA and to the output terminal of the OTA;
    a first resistor connected to the terminal of the PID analog controller and to the first input terminal of the OTA; and
    a second resistor connected to ground and to the first input terminal of the OTA.

16. The PID analog controller of claim 14, wherein the second CMOS switch is connected to the first input terminal of the OTA, and wherein a second input terminal of the OTA is connected to a reference voltage.

17. The PID analog controller of claim 14, wherein the PID analog controller is configured to calculate a difference value between the output voltage of the DC/DC converter and to a reference voltage based on proportional, integral and derivative values.

18. A buck DC/DC converter, wherein the buck DC/DC converter comprises the PID analog controller of claim 14.

19. A method for testing a Proportional-Integral-Derivative (PID) analog controller of a buck Direct Current (DC)/DC converter, the method comprising:
    setting an analog regulation loop, which is formed by an operational transconductance amplifier (OTA) of the PID analog controller and a feedback network of the PID analog controller, to a stable condition and testing a DC parameter of the PID analog controller using a tester, the setting comprising:
        closing a first CMOS switch of the feedback network to electrically connect a gate terminal of an NMOS transistor of the feedback network to an output terminal of the OTA; and opening a second CMOS switch of the feedback network that is connected to a capacitor that is connected between a terminal of the PID analog controller at which an output voltage of the DC/DC converter is received and to a first input terminal of the OTA to electrically disconnect the capacitor from the feedback network, wherein a source terminal of the NMOS transistor is connected to the terminal of the PID analog controller and a drain terminal of the NMOS transistor is connected to a supply voltage; and setting the analog regulation loop to an unstable condition and testing an Alternate Current (AC) parameter of the PID analog controller using the tester, the setting comprising closing the second CMOS switch of the feedback network to electrically connect the capacitor to the feedback network.

20. The method of claim 19, wherein closing the first CMOS switch of the feedback network further includes setting a pull-down transistor connected to the NMOS transistor to a high-impedance state, wherein setting the analog regulation loop to the unstable condition and testing the AC parameter of the PID analog controller further includes setting the capacitance value of the capacitor such that the phase margin of the analog regulation loop becomes negative and the analog regulation loop starts to oscillate.

* * * * *